United States Patent
Javora et al.

(10) Patent No.: US 8,841,900 B2
(45) Date of Patent: Sep. 23, 2014

(54) COMBINED ELECTRICAL MEASUREMENT DEVICE

(75) Inventors: Radek Javora, Brno (CZ); Petr J. Kral, Brno (CZ)

(73) Assignee: ABB Technology AG, Zurich (CH)

( * ) Notice: Subject to any disclaimer, the term of this patent is extended or adjusted under 35 U.S.C. 154(b) by 691 days.

(21) Appl. No.: 12/999,128

(22) PCT Filed: Jun. 12, 2009

(86) PCT No.: PCT/EP2009/057312
§ 371 (c)(1),
(2), (4) Date: Dec. 15, 2010

(87) PCT Pub. No.: WO2009/153223
PCT Pub. Date: Dec. 23, 2009

(65) Prior Publication Data
US 2011/0089933 A1    Apr. 21, 2011

(30) Foreign Application Priority Data

Jun. 19, 2008  (EP) .................................... 08158592

(51) Int. Cl.
*G01R 15/18* (2006.01)
*G01R 15/14* (2006.01)
*G01R 15/16* (2006.01)

(52) U.S. Cl.
CPC ............ *G01R 15/142* (2013.01); *G01R 15/181* (2013.01); *G01R 15/16* (2013.01)
USPC ........ 324/127; 324/126; 324/177; 324/76.11; 324/76.75; 324/522; 361/212; 361/93.1; 29/592

(58) Field of Classification Search
USPC ........... 324/127, 126, 177, 76.11, 76.75, 522, 324/568, 713; 361/212, 93.1; 29/592.1; 336/174
See application file for complete search history.

(56) References Cited

U.S. PATENT DOCUMENTS

| | | | | |
|---|---|---|---|---|
| 3,524,133 | A | * | 8/1970 | Arndt ............................ 324/102 |
| 3,736,541 | A | | 5/1973 | Gould |
| 4,241,373 | A | * | 12/1980 | Mara et al. ...................... 361/92 |
| 4,611,191 | A | * | 9/1986 | Souchere .................... 336/84 R |
| 5,017,859 | A | * | 5/1991 | Engel et al. .................... 324/127 |
| 5,419,300 | A | * | 5/1995 | Maruyama et al. ........... 123/634 |
| 6,717,395 | B2 | * | 4/2004 | Skendzic et al. ........... 324/117 R |
| 7,123,032 | B2 | * | 10/2006 | Yakymyshyn et al. ....... 324/705 |
| 2005/0122122 | A1 | * | 6/2005 | Yakymyshyn et al. ....... 324/705 |
| 2005/0280423 | A1 | * | 12/2005 | Barbour et al. ............... 324/627 |
| 2006/0232265 | A1 | * | 10/2006 | Fritsch et al. ................. 324/142 |
| 2010/0176904 | A1 | * | 7/2010 | Ibuki et al. .................... 336/174 |
| 2012/0019267 | A1 | * | 1/2012 | Tabuchi ........................ 324/686 |

FOREIGN PATENT DOCUMENTS

| | | |
|---|---|---|
| FR | 2698695 | 6/1994 |
| JP | 62132178 | 6/1987 |
| WO | 2009153223 | 12/2009 |

* cited by examiner

*Primary Examiner* — Tung X Nguyen
*Assistant Examiner* — Thang Le
(74) *Attorney, Agent, or Firm* — Michael M. Rickin

(57) ABSTRACT

A combined measurement device for measuring current and/or voltage of an electrical conductor, comprising a supporting body, a current sensor housed inside the supporting body, and a voltage sensor located at least partially inside the supporting body. A shielding is positioned around the current sensor. The current sensor and the voltage sensor are mutually arranged so as the shielding shields at least partially both the current sensor and the voltage sensor against external electric field disturbances.

17 Claims, 4 Drawing Sheets

Figure 1:
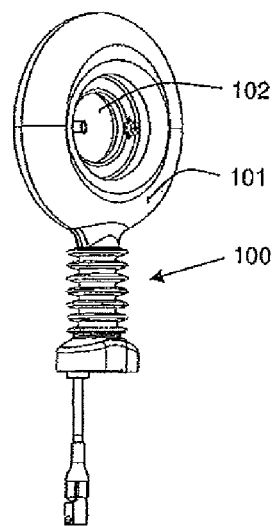

009
COMBINED ELECTRICAL MEASUREMENT DEVICE

The present invention relates to a combined measurement device for measuring current and/or voltage of an electrical conductor.

In the field of electrical applications, it is well known the use of measurement devices for measuring either current and/or voltage of an electrical conductor. Typical examples of such devices are represented by the so-called instrument transformers, e.g. current or voltage transformers.

As it is a common rule for many applications in several technical fields, also these measurement devices are requested to perform their basic tasks in a very efficient functional way and according to constructive solutions which are as much as possible economically competitive, reliable and simplified. Some important requirements to be satisfied in practical applications by these devices are for instance the presence of a good electrical field distribution, suitable safety, output signals with adequate levels of accuracy, in particular in those cases where the output signals coming out from the measurement device have a low level of power and are therefore more sensitive to any kind of disturbances.

To this end, many solutions are at present available on the market offering measuring devices with different characteristics and structures. Examples of voltage measurement devices are capacitive or resistive voltage dividers. An example of a current measurement device is the so-called Rogowski coil which can be manufactured according to different layouts. One commonly used type of Rogowski coil is the one having a single-layer of wire wound around a rigid toroidal core made of non-magnetic material. Other solutions of Rogowski coils use flexible cores, e.g. the winding is wound on a coaxial cable. Yet other solutions foresee the use of a chain of linear coils forming a closed or open circle. In this case it is needed to have a support structure made of solid material, which can support the coils and hold them in their exact position.

At present, there are also offered some combined electronic instrument transformers which usually have a kind of Rogowski coil and either a resistive or capacitive divider for voltage measurement.

Even though prior solutions provide satisfying results, there is still need and room for further improvements.

Hence, the aim of the present invention is to provide a measurement device, and in particular a combined measurement device for measuring current and/or voltage of an electrical conductor, which provides some improvements over known prior art devices.

This aim is achieved by a combined measurement device for measuring current and/or voltage of an electrical conductor, characterized in that it comprises:
 a supporting body;
 a current sensor housed inside said body;
 a voltage sensor located at least partially inside said body;
 a shielding positioned around said current sensor, wherein said current sensor and said voltage sensor are mutually arranged so as said shielding shields at least partially both said current sensor and at least part of said voltage sensor against external electric disturbances. This aim is also achieved by an electrical switchgear and an electrical circuit comprising a combined measurement device as defined in the appended claims.

Figure 2:
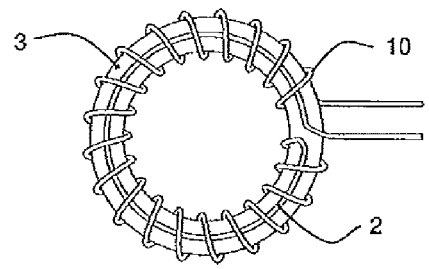
Figure 3:
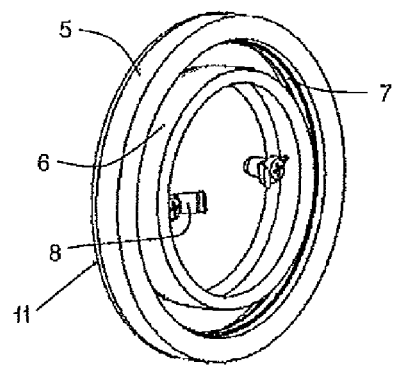
Figure 4:
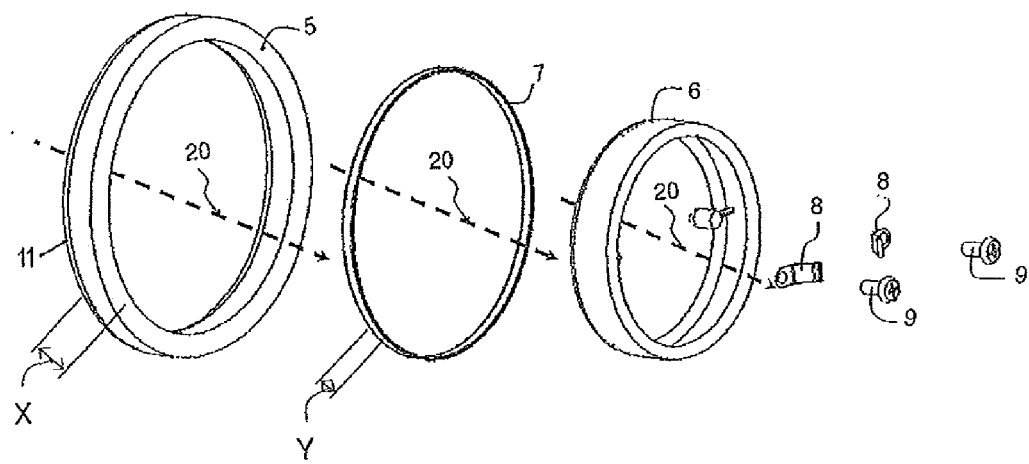
Figure 5:
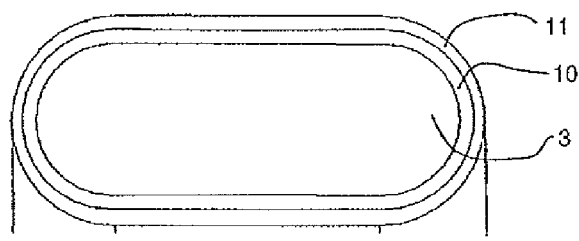
Figure 6:
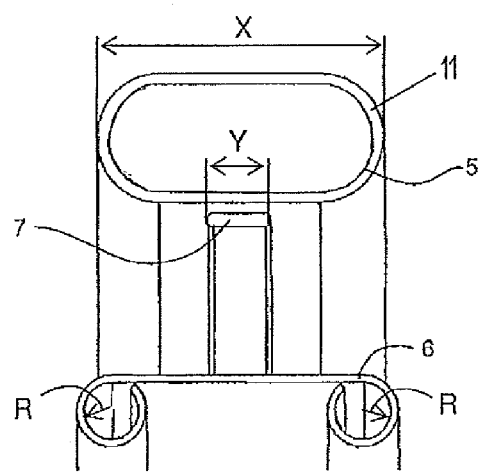
Figure 7:
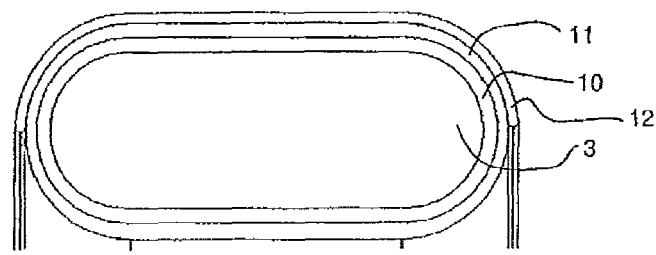
Figure 8:
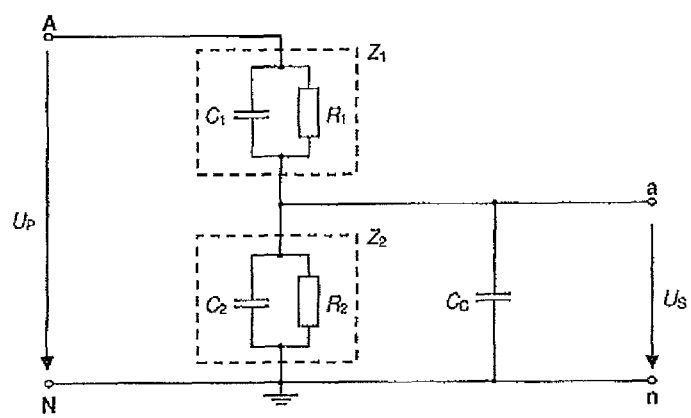
Figure 9:
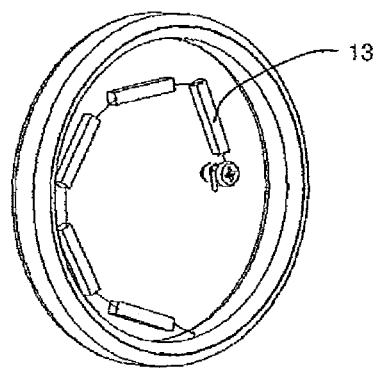
Figure 10:
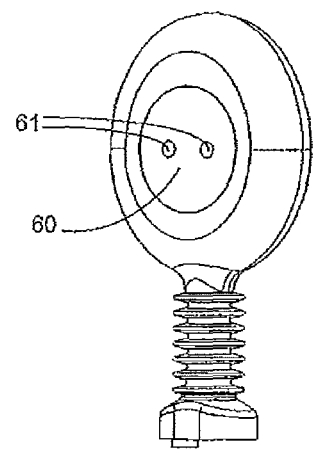
Figure 11:
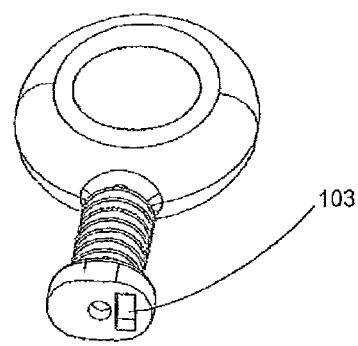

Further characteristics and advantages of the invention will become apparent from the description of preferred but not exclusive embodiments of a combined measurement device according to the invention, illustrated only by way of non-limitative examples in the accompanying drawings, wherein:

FIG. 1 is a perspective view illustrating the combined measurement device according to the invention;
 FIG. 2 shows a possible constructive embodiment of a Rogowski coil;
 FIG. 3 is a perspective view illustrating a possible structure of a shielded Rogowski coil combined with a capacitive voltage divider used in the device of FIG. 1;
 FIG. 4 is an exploded view of FIG. 3;
 FIG. 5 is a schematic view illustrating a partial cross-section of the shielded Rogowski coil used in the measurement device according to the invention;
 FIG. 6 is a partial cross-section schematically illustrating the structure of the shielded to Rogowski coil combined with a capacitive voltage divider of FIG. 3;
 FIG. 7 schematically shows the shielded Rogowski coil of FIG. 5 provided with an additional magnetic shielding;
 FIG. 8 generally describes a basic circuit representing the structure of an impedance voltage divider usable in the voltage measurement device according to the invention;
 FIG. 9 schematically shows an alternative embodiment of a possible structure of a resistive voltage divider shielded by the shielding of the current sensor;
 FIG. 10 is a perspective view illustrating an alternative embodiment of the combined measurement device according to the invention;
 FIG. 11 shows the combined measurement device of FIG. 1 seen from a different perspective.

FIG. 1 shows a possible embodiment of the combined measurement device according to the present invention, globally indicated by the reference numeral 100. In the embodiment illustrated, the device 100 comprises a supporting body 101 having a through opening 102 for allowing passage there through of a conductor (not illustrated) whose current and voltage have to be measured. For example, the supporting body 101 can be completely made of one single insulating material or have an housing or shell made of some insulating materials with the housing preferably filled with a different insulating material. For example, commonly available thermosetting or thermoplastic materials can be used.

The measurement device 100 further comprises a current sensor 5 housed inside the supporting body 101, a voltage sensor located at least partially inside the body 101 itself, and a shielding 11 which is positioned around the current sensor 5 and is connected to ground potential.

Advantageously, the current sensor 5 and the voltage sensor are mutually arranged so as the shielding 11 shields at least partially both the current sensor 5 and at least part of the voltage sensor against external electric field disturbances.

Preferably, the shielding 11 comprises at least one layer of conductive or semi-conductive tape, e.g. NTS117, 04ESR22AA or SEM131800, which is wound around the current sensor 5.

Advantageously, in the measurement device according to the invention, the voltage sensor is located at least partially within the current sensor 5.

According to a particularly preferred embodiment, the current sensor 5 used in the device 100 comprises a Rogowski coil 5 with the at least one layer of semi-conductive tape 11 wound around it, and the voltage sensor comprises a capacitive voltage divider.

Alternatively, the current sensor 5 can comprise a low-power current transformer or an inductive current transformer, while the voltage sensor can be realized by means of a resistive divider, or a combination of a resistive and a capacitive divider.

A typical possible Rogowski coil construction is shown in FIGS. 1 and 5 wherein the winding 10 is connected to the return wire 2 which is placed in the position of the mean radius of the coil.

There is also a possibility to use more winding layers of current sensor 5. With the use of odd number of winding layers, the connection to the return wire 2 is needed. In case of using an even number of winding layers (every second layer wound in opposite direction) there is no need to use the return wire 2.

The winding 10 is wounded on a rigid core 3 made of non-magnetic material which constitutes support for such a winding 10. Clearly, other alternative embodiments of a Rogowski coil 5 can be likewise adapted; for example, it is possible to use a piece-wise linear construction consisting of several linear coils connected in series, a flexible core, an air-core et cetera.

On top of the winding 10 there could be an insulating layer separating the winding 10 from the shielding 11, but this can be avoided by using insulated wires or using one side insulated shielding layer.

The capacitive voltage divider could be realized in several different ways. FIG. 8 shows a schematic circuit description of such divider comprising a primary impedance $Z_1$, a secondary impedance $Z_2$, secondary capacitors and/or cable represented by a capacitance Cc. The primary voltage (Up) is connected to the primary impedance $Z_1$ and the secondary voltage (Us) is measured at the output of such sensor.

If a resistive voltage divider is used as a voltage sensor, resistive parts of primary ($R_1$) and secondary ($R_2$) impedances play an important role, but there are always some stray capacitances ($C_1$, $C_2$) that have an influence on performance of such divider. The possible combination of both resistive and capacitive dividers creates a divider utilizing advantages of both them in order to reach better performance. In this case the primary impedance can be constituted by the capacitance ($C_1$) and the secondary impedance can be constituted by ($R_2$).

FIGS. 3 and 4 illustrate a possible preferred structure of a capacitive voltage divider used in the device 100 according to the invention. In the embodiment illustrated, the capacitive voltage divider comprises a primary electrode 6 formed by an electrically conductive ring which is positioned within the Rogowski coil 5, namely within the core 3, and a capacitive electrode 7 which is also constituted for example by an electrically conductive ring which is located within the core 3 of the Rogowski coil 5 and around the primary electrode 6. Advantageously, the capacitive electrode 7 has a width Y which is smaller than the width X of the shielded Rogowski coil, i.e. the width X of the shielding 11 positioned around the Rogowski coil. As illustrated in FIGS. 4 and 6, such widths X and Y are the side extensions of the assembly Rogowski coil-shielding 11 positioned around it and of the capacitive electrode 7, respectively, measured along a reference axis 20 substantially perpendicular to front/back face of the shielded current sensor.

In this way, the shielding 11 shields from electric field disturbances not only the current sensor but also the voltage sensor, and in particular at least the capacitive electrode 7 in a very effective and efficient way.

The primary electrode 6 is devoted to be electrically connected directly or indirectly, through suitable means, to the conductor whose current and voltage have to be measured. In the embodiment illustrated, said connection means are represented by contact springs 8 fixed on the primary electrode 6 by means of screws 9. In this way the primary electrode 6 can be connected through the thread inserts to which the contact springs 8 are connected to safely bring the voltage signal from a primary conductor to the primary electrode 6 itself. Alternatively, depending on the applications, the connection means can be realized differently. For example, if the primary electrode 6 can be connected directly to the conductor to be measured, simple electrical wires can be used.

Preferably, the primary electrode 6 is usually constructed with rounding on its sides (see FIG. 6) in order to create a proper distribution of electric fields inside or outside the body 101. In particular, the primary electrode 6 has its sides rounded preferably with radius R bigger than 1 mm so as to have reduced electric field intensities.

Hence, the primary capacitance $C_1$ of the voltage capacitive divider is created between the primary electrode 6 and the capacitive electrode 7. The secondary capacitance $C_2$ is created between the capacitive electrode 7 and the shielding 11 of the current sensor 5 that is at ground potential.

If the value of capacitance $C_2$ is not sufficient in order to create the desired ratio of the voltage divider, one or more fixed capacitors Cc can be added in parallel to the secondary capacitance $C_2$. The additional fixed capacitors can be positioned into a cavity 103 (see FIG. 11) in the body 101 after casting, or they can be cast directly into the body 101 itself.

Alternatively, they can be located also outside the body 101.

Additional capacitance Cc can be created by other means as well.

For proper operation of capacitive voltage divider, the capacitive electrode 7 must be separated or insulated from shielding 11 in order to create a capacitance $C_2$.

As above mentioned, in an alternative embodiment, the voltage sensor can comprise a resistive voltage divider. In this case the resistive voltage divider comprises a plurality of resistors 13 at least some of which are positioned within the Rogowski coil 5. In particular, the resistors 13 are preferably positioned under the shielding 11 as much as possible hidden under the shielding 11 itself, i.e. their lateral extension is comprised within the lateral extension (width X) of the shielded Rogowski coil 5.

Finally, if desired, the measurement device 100 comprises also an additional shielding 12 made of magnetic material for shielding magnetic disturbances. As illustrated in FIG. 7, the additional shielding 12 is preferably positioned around the shielding 11 only at the outer perimeter of the Rogowski coil 5 in order to keep the desired magnetic field created by the current carrying conductor being measured. Such shielding 12 could be located also on the sides of Rogowski coil, but not fully along the inner perimeter of the coil.

In an alternative embodiment schematically illustrated in FIG. 10, a primary conductor 60 is cast directly, i.e. it is part of the body 101 and there is no opening 102. In this case the primary conductor 60 functionally replaces the primary electrode 6, while the remaining part of the device remains the same as previously described. Hence, the primary capacitance C1 is formed between the primary conductor 60 and the capacitive electrode 7 and the primary conductor 60 also forms the electrical conductor whose current and/or voltage has to be measured.

Holes 61 can be provided for electrical connection to external conductors through suitable means, such as connection springs etc.

The combined measurement device 100 according to the invention is particularly suitable for use in switchgear, such as medium voltage switchboards, circuit breakers et cetera, as well as in electrical circuits, comprising a conductor whose current and/or voltage have to be measured. Hence, further objects of the present invention relate to an electrical switchgear and an electrical circuit comprising a combined measurement device 100 as previously described and claimed.

It has been found that the combined measurement device 100 according to the invention fully achieves the intended aim providing some advantages and improvements over the known solutions. Indeed, as above described, the device 100 thanks to the described layout and mutual positioning of the various components, in particular of the voltage sensor located within the shielded current sensor, allows to have a unique shielding 11 which shields at the same time both the current sensor 5 and at least part of the voltage sensor from electric field disturbances, without the need for additional shields. Furthermore, the device 100 features a whole structure which has a simplified design and allows cheap and easy manufacturing and assembly.

The current measurement device 100 thus conceived is susceptible of modifications and variations, all of which are within the scope of the inventive concept as defined in the to claims and the above description; for example, the primary electrode 6 and the capacitive electrode 7 can be differently shaped according to the applications. All the details may furthermore be replaced with technically equivalent elements. In practice, the materials used, as well as the dimensions, may be any according to the requirements and the state of the art so long as they are compatible with the specific use and allow achieving the intended results.

The invention claimed is:

1. A combined measurement device for measuring current and/or voltage of an electrical conductor, said device comprising:
   a supporting body;
   a current sensor housed inside said supporting body;
   a voltage sensor located at least partially inside said supporting body;
   a shielding positioned around said current sensor, wherein said current sensor and said voltage sensor are mutually arranged so as said shielding shields at least partially both said current sensor and at least part of said voltage sensor against external electric disturbances; and
   a capacitive electrode having a width which is smaller than a width of said shielding and said voltage sensor comprises a capacitive voltage divider having a secondary capacitance ($C_2$) comprising said capacitive electrode and said shielding.

2. The measurement device according to claim 1 wherein said shielding comprises at least one layer of conductive or semi-conductive tape wound around said current sensor.

3. The measurement device according to claim 2 wherein said voltage sensor is located at least partially within the current sensor.

4. The measurement device according to claim 2 wherein said current sensor comprises a Rogowski coil with said at least one layer of conductive or semi-conductive tape wound around it.

5. The measurement device according to claim 1 wherein said capacitive voltage divider has a primary capacitance ($C_1$) comprising a primary electrode which is positioned within a Rogowski coil and is suitable to be electrically connected to said electrical conductor.

6. The measurement device according to claim 5 wherein said primary capacitance ($C_1$) comprises a capacitive electrode which is located within said Rogowski coil around said primary electrode.

7. The measurement device according to claim 1 wherein said capacitive voltage divider has a primary capacitance ($C_1$) formed by a primary electrical conductor which is positioned within a Rogowski coil and is cast directly on said supporting body, and by a capacitive electrode which is located within said Rogowski coil around said primary electrical conductor.

8. The measurement device according to claim 1, wherein said capacitive voltage divider comprises one or more fixed capacitors (Cc) connected in parallel to said secondary capacitance ($C_2$).

9. The measurement device according to claim 1 wherein said voltage sensor comprises a resistive voltage divider comprising a plurality of resistors at least some of which are positioned within a Rogowski coil under said shielding.

10. The measurement device according to claim 1 further comprising an additional shielding for shielding magnetic disturbances, said additional shielding being positioned around said shielding at the outer perimeter of a Rogowski coil.

11. Electrical switchgear comprising a combined measurement device for measuring current and/or voltage of an electrical conductor, said device comprising:
   a supporting body;
   a current sensor housed inside said supporting body;
   a voltage sensor located at least partially inside said supporting body;
   a shielding positioned around said current sensor, wherein said current sensor and said voltage sensor are mutually arranged so as said shielding shields at least partially both said current sensor and at least part of said voltage sensor against external electric disturbances; and
   a capacitive electrode having a width which is smaller than a width of said shielding and said voltage sensor comprises a capacitive voltage divider having a secondary capacitance ($C_2$) comprising said capacitive electrode and said shielding.

12. An electric circuit comprising a conductor whose current and/or voltage is to be measured, said circuit further comprising a combined measurement device for measuring current and/or voltage of an electrical conductor, said device comprising:
   a supporting body;
   a current sensor housed inside said supporting body;
   a voltage sensor located at least partially inside said supporting body;
   a shielding positioned around said current sensor, wherein said current sensor and said voltage sensor are mutually arranged so as said shielding shields at least partially both said current sensor and at least part of said voltage sensor against external electric disturbances; and
   a capacitive electrode having a width which is smaller than a width of said shielding and said voltage sensor comprises a capacitive voltage divider having a secondary capacitance ($C_2$) comprising said capacitive electrode and said shielding.

13. The measurement device of claim 1 wherein said supporting body is toroid shaped.

14. The electrical switchgear of claim 11 wherein said supporting body is toroid shaped.

15. The electrical switchgear of claim 11 wherein said capacitive voltage divider comprises one or more fixed capacitors (Cc) connected in parallel to said secondary capacitance ($C_2$).

16. The electric circuit of claim 12 wherein said supporting body is toroid shaped.

17. The electric circuit of claim 12 wherein said capacitive voltage divider comprises one or more fixed capacitors (Cc) connected in parallel to said secondary capacitance ($C_2$).

* * * * *